(12) United States Patent
Seong

(10) Patent No.: US 9,305,615 B2
(45) Date of Patent: Apr. 5, 2016

(54) SEMICONDUCTOR DEVICE

(71) Applicant: SK hynix Inc., Gyeonggi-do (KR)

(72) Inventor: Jin Yong Seong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/198,151

(22) Filed: Mar. 5, 2014

(65) Prior Publication Data

US 2015/0103606 A1    Apr. 16, 2015

(30) Foreign Application Priority Data

Oct. 14, 2013    (KR) .................. 10-2013-0122175

(51) Int. Cl.
*G11C 7/10*    (2006.01)
*G11C 7/22*    (2006.01)

(52) U.S. Cl.
CPC ............ *G11C 7/1066* (2013.01); *G11C 7/1069* (2013.01); *G11C 7/222* (2013.01)

(58) Field of Classification Search
CPC ..... G11C 7/1066; G11C 7/1069; G11C 7/222
USPC .............. 365/189.07; 327/362, 378, 393, 398
See application file for complete search history.

(56) References Cited

U.S. PATENT DOCUMENTS

| 4,680,780 | A | * | 7/1987 | Agoston | ................ | H04L 7/0331 |
| | | | | | | 327/48 |
| 5,689,460 | A | * | 11/1997 | Ooishi | .................... | G11C 5/143 |
| | | | | | | 327/530 |
| 6,262,606 | B1 | * | 7/2001 | Tamjidi | ................ | H03K 17/693 |
| | | | | | | 327/108 |
| 6,985,375 | B2 | * | 1/2006 | Baker | .................... | G11C 7/067 |
| | | | | | | 365/148 |
| 7,483,327 | B2 | * | 1/2009 | Qureshi | ................ | G06F 1/3203 |
| | | | | | | 365/189.07 |
| 2003/0212930 | A1 | * | 11/2003 | Aung | ....................... | G11C 7/22 |
| | | | | | | 714/700 |
| 2005/0213646 | A1 | * | 9/2005 | Barkaro | .................. | H03F 3/217 |
| | | | | | | 375/220 |
| 2005/0283630 | A1 | * | 12/2005 | Shikata | ................ | G06F 1/3203 |
| | | | | | | 713/322 |
| 2007/0075792 | A1 | * | 4/2007 | Liu | .................... | G01R 31/2856 |
| | | | | | | 331/57 |
| 2009/0016124 | A1 | * | 1/2009 | Kim | ..................... | G11C 7/1078 |
| | | | | | | 365/194 |
| 2009/0326843 | A1 | * | 12/2009 | Song | ....................... | G01K 7/32 |
| | | | | | | 702/65 |
| 2010/0031065 | A1 | * | 2/2010 | Futa | ..................... | H03K 3/0315 |
| | | | | | | 713/194 |
| 2010/0164571 | A1 | * | 7/2010 | Jang | ........................ | H03K 5/13 |
| | | | | | | 327/158 |
| 2010/0172181 | A1 | * | 7/2010 | Murakami | ............... | 365/185.12 |
| 2010/0189160 | A1 | * | 7/2010 | Kim | .......................... | G01K 1/02 |
| | | | | | | 374/170 |
| 2010/0194442 | A1 | * | 8/2010 | Walley | ............... | H03K 19/0008 |
| | | | | | | 327/100 |
| 2011/0188331 | A1 | * | 8/2011 | Jin | ........................... | G11C 7/00 |
| | | | | | | 365/193 |
| 2012/0042116 | A1 | * | 2/2012 | Park | .................... | G06F 13/4086 |
| | | | | | | 711/102 |
| 2012/0105107 | A1 | * | 5/2012 | Moon | .................... | H03D 13/00 |
| | | | | | | 327/40 |

FOREIGN PATENT DOCUMENTS

| KR | 1020060038608 | 5/2006 |
| KR | 1020110121528 | 11/2011 |

* cited by examiner

*Primary Examiner* — Vu Le
*Assistant Examiner* — Sung Cho
(74) *Attorney, Agent, or Firm* — IP & T Group LLP

(57) ABSTRACT

A semiconductor device includes a data output circuit suitable for transferring an output data to an external data line during a data output operation, and a controller suitable for generating control signals for controlling the data output circuit during the data output operation, wherein the data output circuit senses a variation and transfers the output data to the external data line based on the sensing result.

17 Claims, 4 Drawing Sheets

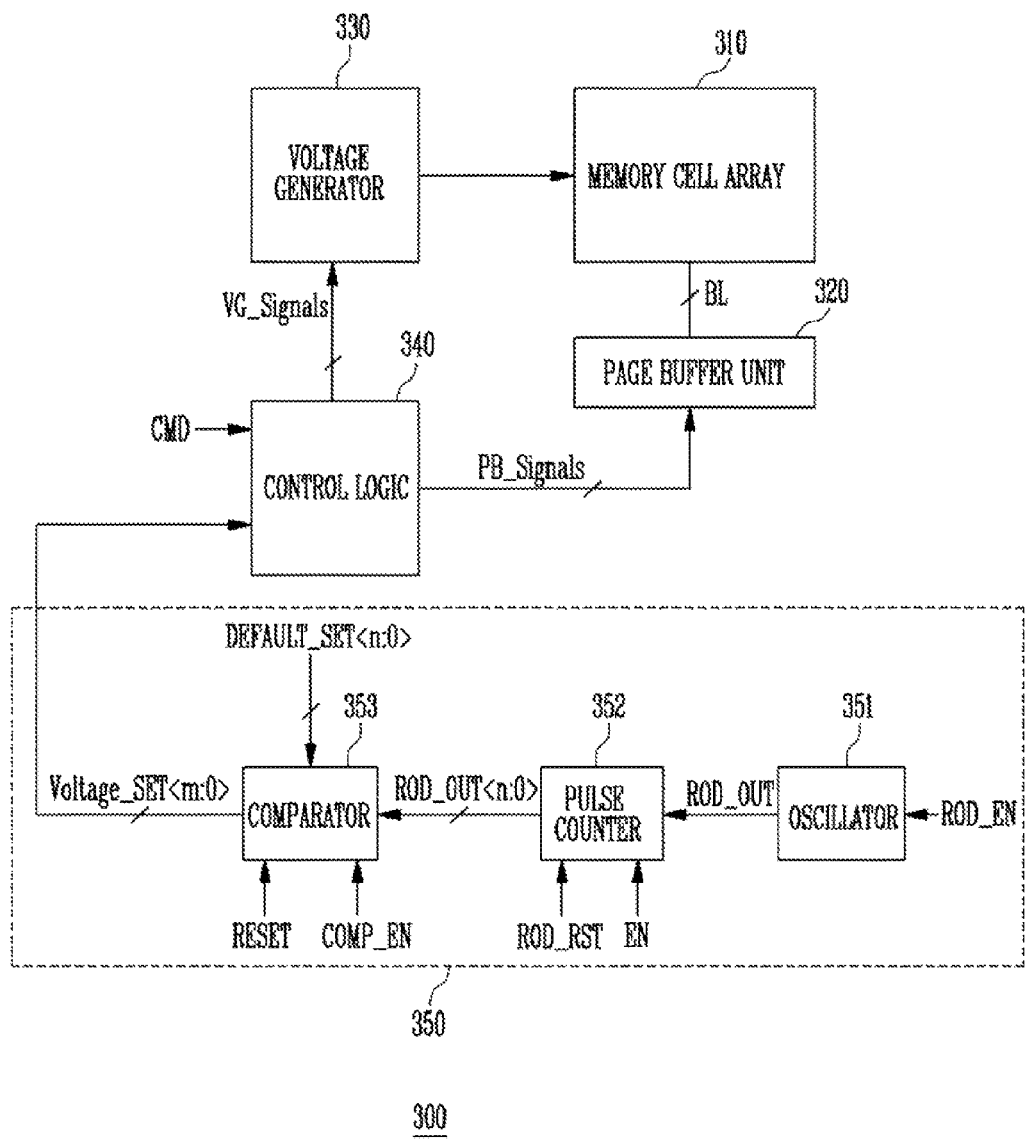

SEMICONDUCTOR DEVICE

CROSS-REFERENCE TO RELATED APPLICATION

The present application claims priority on Korean patent application number 10-2013-0122175, filed on Oct. 14, 2013, the entire disclosure of which is incorporated herein in its entirety by reference.

BACKGROUND

1. Field of Invention

Various exemplary embodiments of the present invention relate to a semiconductor design technology, and more particularly, to a skew control of a semiconductor device.

2. Description of Related Art

In general, a semiconductor device includes a data output circuit that may externally output data to be generated in an integrated circuit included in the chip. Recently, a semiconductor device with a high degree of integration, low power consumption, and a high operating speed has been in demand.

FIG. 1 is a block diagram illustrating a conventional semiconductor device 10.

Referring to FIG. 1, the semiconductor device 10 may include an internal circuit 11, an output pre-driver 12 and an output driver 13. The internal circuit 11 may include memory cells for storing data and peripheral circuits. The output pre-driver 12 may output a pull-up (PU) signal and a pull-down (PD) signal based on an output data signal bout output from the internal circuit 11. The output driver 13 may output data through an external data line DQ based on the pull-up (PU) signal and the pull-down (PD) signal.

The performance of the semiconductor device 10 may vary greatly depending on a process, voltage, or temperature variation (PVT), especially the process variation. Particularly, a driving force of an output driver within a memory device that transfers stored data to an external system may vary considerably depending on the process variation.

SUMMARY

Exemplary embodiments of the present invention are directed to a semiconductor device capable of stably outputting data or stably performing internal operations despite a variation of the semiconductor device.

Other embodiments of the present invention are directed to a semiconductor device capable of stably outputting data or stably performing internal operations despite a process variation of the semiconductor device.

A semiconductor device according to an embodiment of the present invention may include a data output circuit suitable for transferring an output data to an external data line during a data output operation, and a controller suitable for generating control signals for controlling the data output circuit during the data output operation, wherein the data output circuit senses a variation and transfers the output data to the external data line based on the sensing result.

A semiconductor device according to an embodiment of the present invention may include a memory unit suitable for including at least one memory chip, wherein the at least one memory chip stores data or outputs data stored therein, a data output circuit suitable for receiving the data, output from the memory unit, and transferring the data to an external data line, and a controller suitable for controlling operations of the memory unit and outputting control signals to control the data output circuit during a data output operation, wherein the data output circuit senses a change in clock number varying depending on internal conditions and controls a speed of an operation of transferring the data to the external data line based on the sensing result.

A semiconductor device according to an embodiment of the present invention may include a memory cell array including a plurality of memory cells, a peripheral circuit suitable for applying operating voltages to a word line of the memory cell array during a program/read operation, wherein the peripheral circuit controls a voltage level of a bit line of the memory cell array or senses the voltage level of the bit line, a skew compensation circuit suitable for sensing a variation and outputting the sensing result, and a control logic suitable for outputting control signals to control the peripheral circuit during the program/read operation, wherein the control logic controls activation timing of the control signals or voltage levels of the operating voltages based on the sensing result.

BRIEF DESCRIPTION OF THE DRAWINGS

FIG. 6 is a block diagram illustrating a semiconductor device according to an embodiment of the present invention.

DETAILED DESCRIPTION

Figure 1:
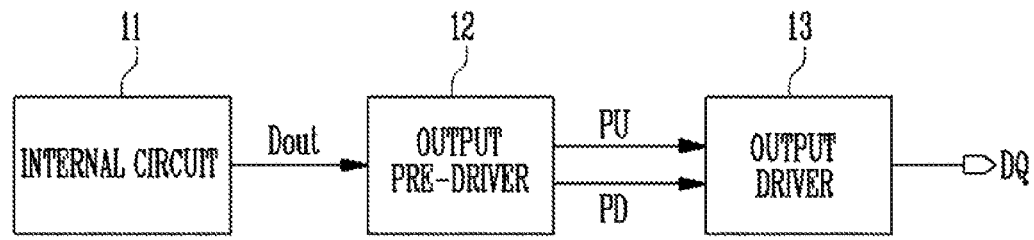
FIG. 1 is a block diagram illustrating a conventional semiconductor device.

Hereinafter, various embodiments of the present invention will be described in detail with reference to the accompanying drawings. The figures are provided to enable those of ordinary skill in the art to make and use the present invention according to the exemplary embodiments of the present invention. Throughout the disclosure, reference numerals correspond directly to the like numbered parts in the various figures and embodiments of the present invention.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 2:
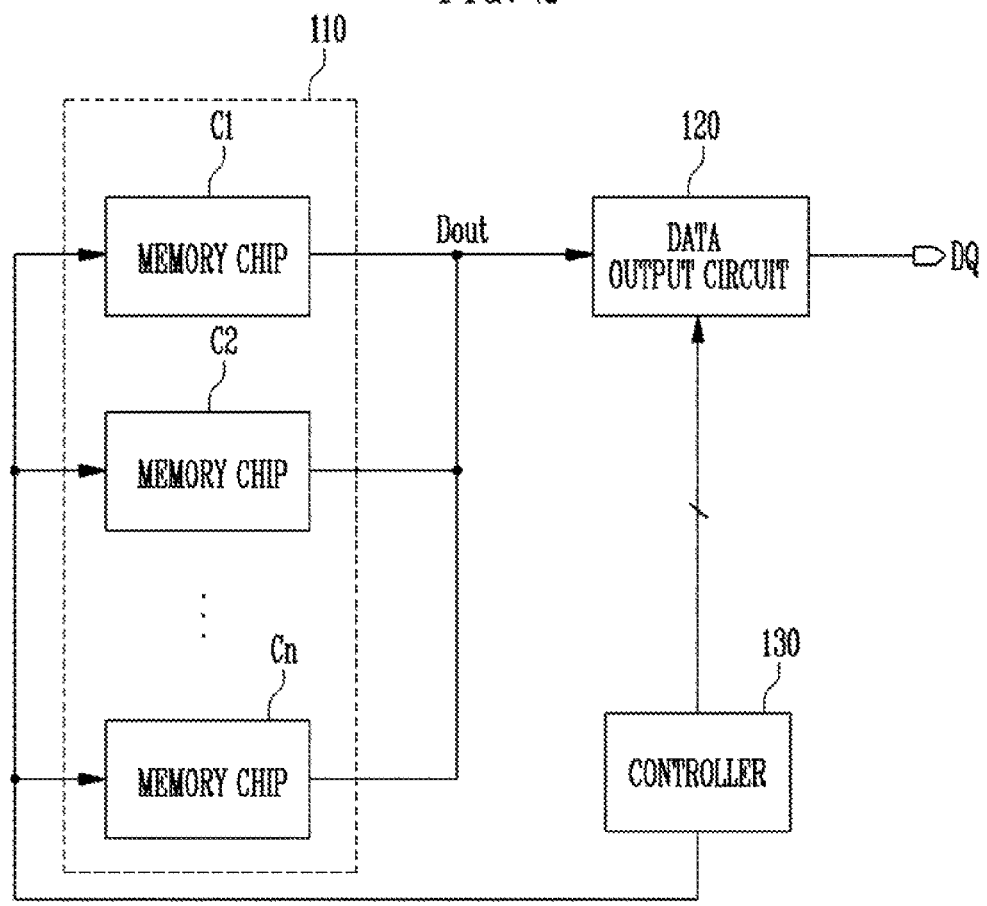
FIG. 2 is a block diagram illustrating a semiconductor device according to an embodiment of the present invention.

FIG. 2 is a block diagram illustrating a semiconductor device 100 according to an embodiment of the present invention.

Referring to FIG. 2, the semiconductor device 100 may include a memory unit 110, a data output circuit 120, and a controller 130.

The memory unit 110 may include a plurality of memory chips C1 to Cn. Each of the memory chips C1 to Cn may include circuits that store data therein. Each of the memory chips C1 to Cn may perform a program operation, a read operation and an erase operation in response to a control signal that is output from the controller 130.

The data output circuit 120 may be connected to a data output line (or a data output terminal) of the memory chips C1 to Cn. The data output circuit 120 may receive an output data signal Dout from a memory chip selected among the memory chips C1 to Cn, and output the output data signal Dout to an external data line DQ during a data output operation. During the data output operation, the data output circuit 120 may compare a cycle of an internal clock with that of a predetermined clock to sense a change in cycle of the internal clock and control a driving force (or a drivability) of an output driver to perform the data output operation. In other words, the data output circuit 120 may detect a ring oscillator delay, which varies depending on a PVT variation (e.g., a process variation), and generate a driver set code.

The controller 130 may generate a plurality of first control signals to control the memory chips C1 to Cn in response to an external command. Further, the controller 130 may generate a plurality of second control signals to control the data output circuit 120 during the data output operation.

Figure 3:
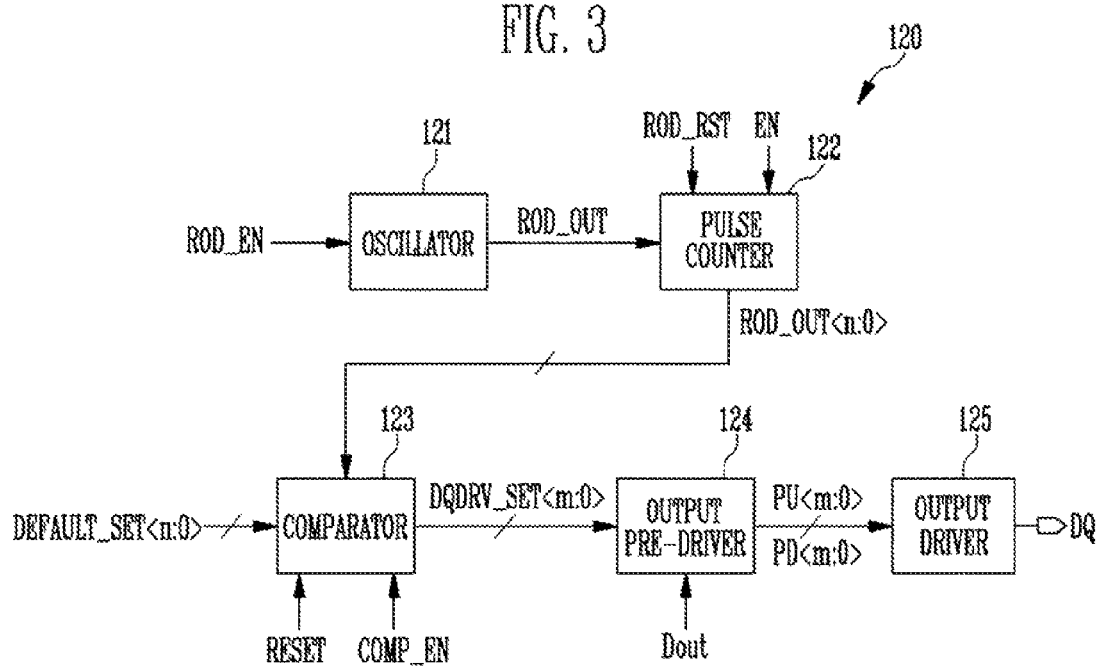
FIG. 3 is a detailed diagram of a data output circuit shown in FIG. 2.

FIG. 3 is a detailed diagram of the data output circuit 120 shown in FIG. 2.

Referring to FIG. 3, the data output circuit 120 may include an oscillator 121, a pulse counter 122, a comparator 123, an output pre-driver 124, and an output driver 125.

The oscillator 121 may generate an output clock (or, a sample clock) ROD_OUT in response to an oscillator enable signal ROD_EN. For example, the oscillator 121 may include a ring oscillator. The output clock ROD_OUT may be output as a clock signal having a predetermined cycle. A cycle of the output clock ROD_OUT may become longer or shorter depending on a PVT variation (e.g., a process variation) in the semiconductor device. The process variation may include a performance variation of transistors included in the oscillator 121 depending on factors, such as a thickness of a gate dielectric and a height of an effective field oxide layer, which may vary during manufacturing process of the semiconductor device.

The pulse counter 122 may be initialized in response to a reset signal ROD_RST, count the number of clock cycles (i.e. cycle number) of the output clock ROD_OUT output to the oscillator 121 for a predetermined period in response to a counter enable signal EN, and output count bit signals ROD_OUT<n:0>. For reference, the predetermined period may be defined by a pulse width of the counter enable signal EN.

The comparator 123 may compare the count bit signals ROD_OUT<n:0> with predetermined reference bit signals DEFAULT_SET<n:0> in response to a comparator enable signal COMP_EN, and output driver set signals (or a driver set code) DQDRV_SET<m:0> based on the comparison result. The comparator 123 may be initialized in response to a reset signal RESET.

The output pre-driver 124 may output pull-up bit signals PU<m:0> and pull-down bit signals PD<m:0> based on the driver set signals DQDRV_SET<m:0> and the output data signal Dout output from the memory chip selected among the memory chips C1 to Cn. Here, the pull-up bit signals PU<m:0> and the pull-down bit signals PD<m:0> may be driver control signals. When the output pre-driver 124 outputs the pull-up bit signals PU<m:0> and the pull-down bit signals PD<m:0> based on the output data signal Dout, the output pre-driver 124 may reduce or increase the number of bit signals activated among the pull-up bit signals PU<m:0> and the pull-down bit signals PD<m:0>.

The output driver 125 may output data by controlling a voltage level of the external data line DQ based on the pull-up bit signals PU<m:0> and the pull-down bit signals PD<m:0> output from the output pre-driver 124. For example, when the output pre-driver 124 activates the pull-up bit signals PU<m:0> the output driver 125 may increase the voltage level of the external data line DQ to a high level, and when the output pre-driver 124 activates the pull-down bit signals PD<m:0>, the output driver 125 may reduce the voltage level of the external data line DQ to a low level.

Figure 4:
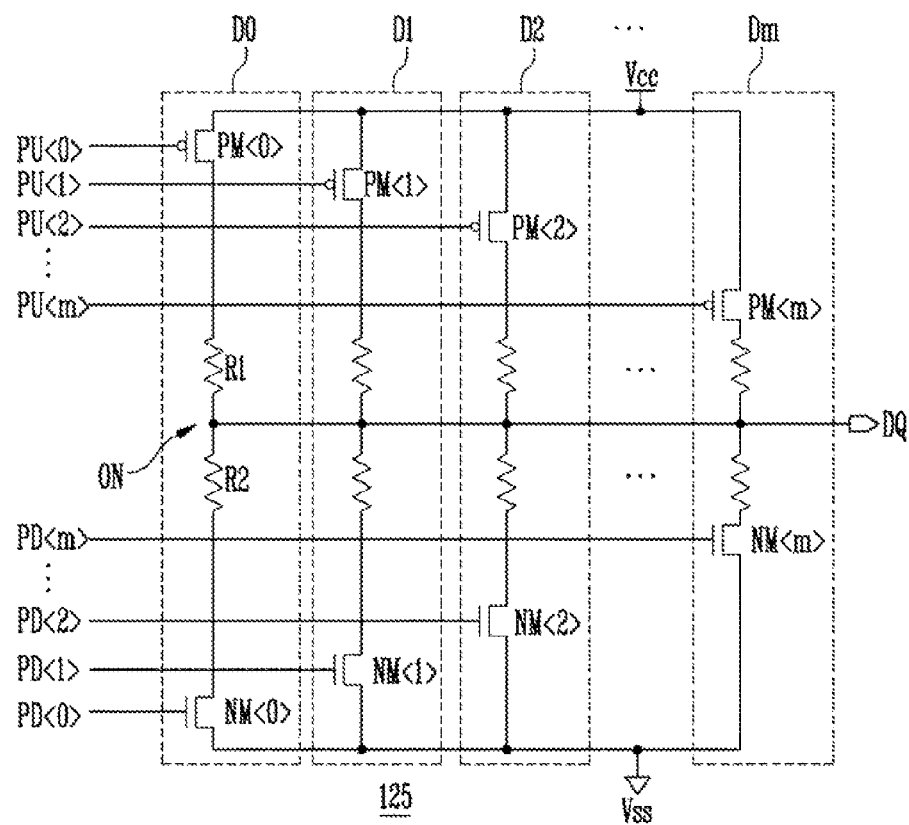
FIG. 4 is a detailed diagram of an output, driver shown in FIG. 3.

FIG. 4 is a detailed diagram of the output driver 125 shown in FIG. 3.

Referring, to FIG. 4, the output driver 125 may include a plurality of unit drivers D0 to Dm. The drivers D0 to Dm may control the voltage level of the external data line DQ by supplying a power voltage Vcc to the external data line DQ or discharging the external data line DQ to a ground voltage Vss based on the pull-up bit signals PU<m:0> and the pull-down bit signals PD<m:0>, which are output from the output pre-driver 124. That is, the drivers D0 to Dm may selectively drive the external data line DQ.

The driver D0, as an example, may include a PMOS transistor PM<0>, resistors R1 and R2, and an NMOS transistor NM<0> that are coupled in series between the power voltage Vcc and the ground voltage Vss. The PMOS transistor PM<0> may operate in response to the pull up bit signal PU0>, and the NMOS transistor NM<0> may operate in response to the pull-down bit signal PD<0>. That is, when the pull-up bit signal PU<0> and the pull-down bit signal PD<0> are at a logic low level, the driver D0 may increase the voltage level of the external data line DQ by supplying the power voltage Vcc to an output node ON between the resistors R1 and R2. Furthermore, when the pull-up bit signal PU<0> and the pull-down bit signal PD<0> are at a logic high level, the driver D0 may discharge the voltage level of the external data line DQ to a low level by supplying the ground voltage Vss to the output node ON between the resistors R1 resistor R2.

The remaining drivers, i.e., D1 to Dm, may have a similar structure to the driver D0. However, the drivers D1 to Dm may correspond to pull-up bit signals PU<m:1> and pull-down bit signals PD<m:1> respectively. More specifically, the driver D2 may correspond to the pull-up bit signal PU<1> and the pull-down bit signal PD<1> and the driver Dm may correspond to the pull-up bit signal PU<m> and the pull-down bit signal PD<m>. In other words, a single driver may correspond to a single pull-up bit signal and a single pull-down bit signal.

The number of drivers D0 to Dm activated in the output driver 125 may decrease as the number of bit signals activated among the pull-up bit signals PU<m:0> and the pull-down bit signals PD<m:0> increases. Meanwhile, the number of drivers activated in the output driver 125 may increase as the number of bit signals activated among the pull-up bit signals PU<m:0> and the pull-down bit signals PD<m:0> decreases. Therefore, the output driver 125 may control a time period in which the voltage level of the external data line DQ is increased to a high level and a time period in which the voltage level of the external data line DQ is reduced to a low level. That is, the output driver 125 may adjust a data transition time thereof.

A method of operating a semiconductor device according to an embodiment of the present invention will be described below with reference to FIGS. 2 to 4.

The oscillator 121 may output the clock ROD_OUT in response to the oscillator enable signal ROD_EN during a data output operation. The oscillator 121 may change a cycle of the output clock ROD_OUT based on internal conditions of the semiconductor device, especially a process variation.

The pulse counter 122 may count a clock number of the output clock ROD_OUT output to the oscillator 121 for the predetermined period in response to the counter enable signal EN and output the count bit signals ROD_OUT<n:0>.

The comparator 123 may compare the count bit signals ROD_OUT<n:0> output from the pulse counter 122 with the predetermined reference bit signals DEFAULT_SET<n:0>, and output the driver set signals DQDRV_SET<m:0>. In other words, the comparator 123 may compare the count bit signals ROD_OUT<n:0> with the predetermined reference bit signals DEFAULT_SET<n:0> and output the driver set signals DQDRV_SET<m:0>.

The output pre-driver 124 may output the pull-up bit signals PU<m:0> and the pull-down bit signals PD<m:0> based on the output data signal Dout, which is output from the memory chip selected among the memory chips C1 to Cn, and the driver set signals DQDRV_SET<m:0>. When the output pre-driver 124 outputs the pull-up bit signals PU<m:0> or the pull-down bit signals PD<m:0> depending on the output data signal Dout, the output pre-driver 124 may reduce or increase the number of bit signals activated, among the pull-up bit signals PU<m:0> or the pull-down bit signals PD<m:0>, which are selectively activated based on the driver set signals DQDRV_SET<m:0>. Here, the set signals DQDRV_SET<m:0> may reflect a result of comparing the count bit signals ROD_OUT<n:0> with the predetermined reference bit signals DEFAULT_SET<n:0>.

For example, when the cycle of the output clock ROD_OUT is increased by changes in internal conditions of the semiconductor device, the comparator 123 may determine that the count bit signals ROD_OUT<n:0> are less than the predetermined reference bit signals DEFAULT_SET<n:0> and output the driver set signals DQDRV_SET<m:0> corresponding to differences therebetween. The output pre-driver 124 may increase the number of bit signals activated, among the pull-up bit signals PU<m:0> or pull-down bit signals PD<m:0>, to more than a predetermined number based on the driver set signals DQDRV_SET<m:0>.

Furthermore, when the cycle of the output dock ROD_OUT is reduced by changes in internal conditions of the semiconductor device, the comparator 123 may determine that the count bit signals ROD_OUT<n:0> are greater than the predetermined reference bit signals DEFAULT_SET<n:0> and output the driver set signals DQDRV_SET<m:0> corresponding to differences therebetween. The output pre-driver 124 may reduce the number of bit signals activated, among the pull-up bit signals PU<m:0> and the pull-down bit signals PD<m:0>, to less than the predetermined number based on the driver set signals DQDRV_SET<m:0>.

The output driver 125 may output data by controlling the voltage level of the external data line DQ based on the pull-up bit signals PU<m:0> and the pull-down bit signals PD<m:0>, which are output from the output pre-driver 124. For example, when the output pre-driver 124 activates the pull-up bit signals PU<m:0>, the output driver 125 may increase the voltage level of the external data line DQ to a high level. When the output pre-driver 124 activates the pull-down bit signals PD<m:0>, the output driver 125 may reduce the voltage level of the external data line DQ to a low level.

As described above, according to the embodiment of the present invention, changes in internal conditions of the semiconductor device may be sensed by counting the dock number of the output clock ROD_OUT, which is output from the oscillator 121, and comparing the counted clock number with a predetermined counting number. The number of bit signals activated among the pull-up bit signals PU<m<m:0> and the pull-down bit signals PD<m:0>, which are output from the output pre-driver 124, may be controlled based on the sensing result to control the driving force of the output driver 125. As a result, a stabilized data output operation may be performed.

Figure 5:
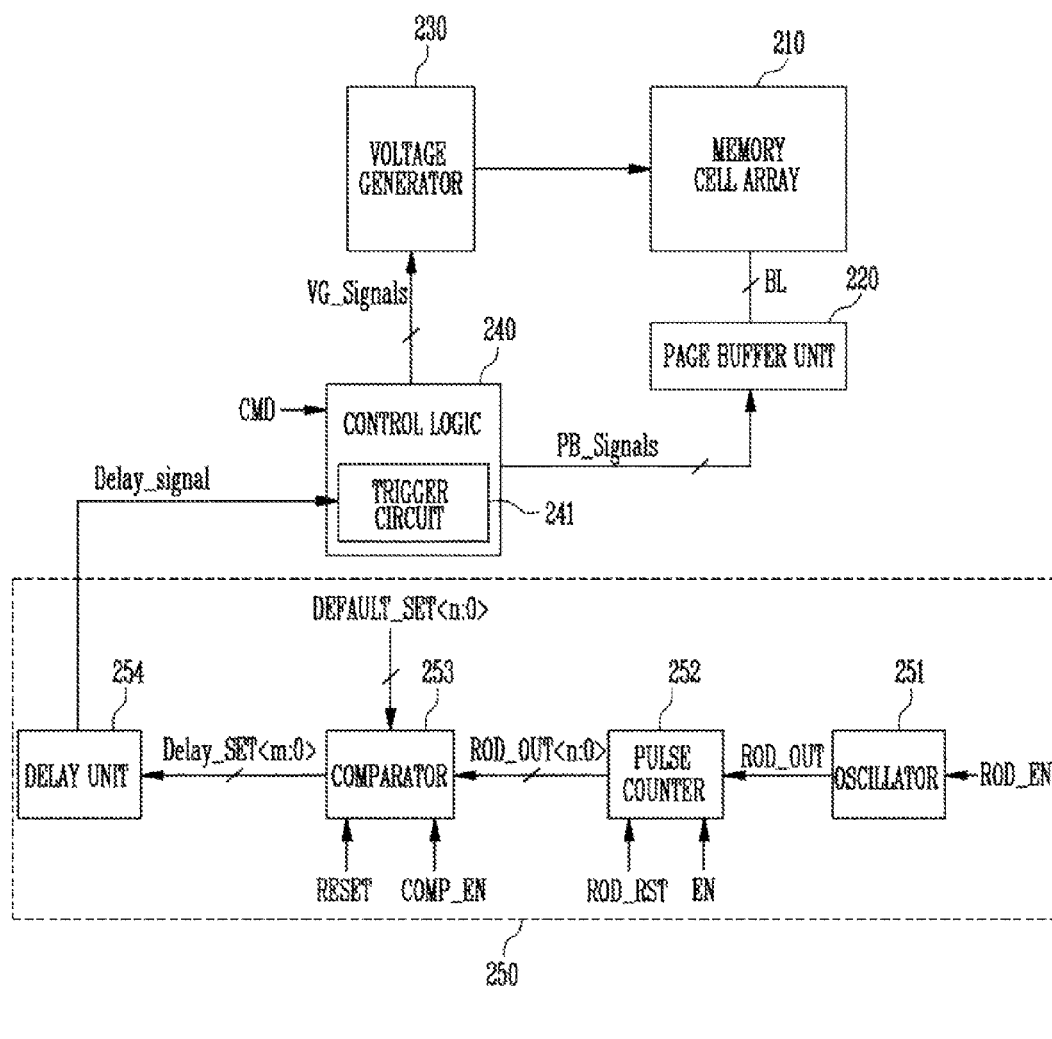
FIG. 5 is a block diagram illustrating a semiconductor device according to an embodiment of the present invention.

FIG. 5 is a block diagram illustrating a semiconductor device 200 according to an embodiment of the present invention.

Referring to FIG. 5, the semiconductor device 200 may include a memory cell array 210, a page buffer unit 220, a voltage generator 230, a control logic 240, and a skew compensation circuit 250.

The memory cell array 210 may include a plurality of memory cells. In the embodiment of the present invention, the memory cells may be non-volatile memory cells. The memory cells may be coupled to a plurality of bit lines BL that are coupled to the page buffer unit 220.

The page buffer unit 220 may include a plurality of page buffers. The page buffers may be coupled to the memory cell array 210 through the bit lines BL. The page buffer unit 220 may temporarily store program data during a program operation and control voltage levels of the corresponding bit lines BL depending on the temporarily stored program data. In addition, the page buffer unit 220 may sense the voltage levels of the bit lines BL and temporarily store the sensed voltage levels as read data during a read operation. The page buffer unit 220 may operate in response to page buffer control signals PB_Signals that are output from the control logic 240.

The voltage generator 230 may generate operating voltages applied to the memory cells of the memory cell array 210 during the program operation or the read operation. The voltage generator 230 may operate in response to voltage generator control signals VG_Signals, which are output from the control logic 240.

The control logic 240 may be suitable for controlling general operations of the semiconductor device 200 in response to a command CMD that is externally input. In other words, the control logic 240 may output the page buffer control signals PB_Signals for controlling the page buffer unit 220 and the voltage generator control signals VG_Signals for controlling the voltage generator 230 to perform the program operation and the read operation in response to the command CMD.

The control logic 240 may include a trigger circuit 241. The trigger circuit 241 may control operation timing of signals, which are output from the control logic 240, and output the signals based on a delay signal Delay_signal output from the skew compensation circuit 250.

The skew compensation circuit 250 may include an oscillator 251, a pulse counter 252, a comparator 253, and a delay unit 254.

The oscillator 251 may generate an output clock ROD_OUT in response to an oscillator enable signal ROD_EN. For example, the oscillator 251 may include a ring oscillator. The output clock ROD_OUT may be output as a clock signal having a predetermined cycle. A cycle of the output clock ROD_OUT may become longer or shorter depending on a PVT variation (e.g., a process variation) in a semiconductor device. The process variation may include a performance variation of transistors included in the oscillator 251 depending on factors, such as a thickness of a gate dielectric and a height of an effective field oxide layer, which may vary during a manufacturing process of the semiconductor device.

The pulse counter 252 may be initialized in response to a reset signal ROD_RST and count the number of clock cycles of the output clock ROD_OUT, which is output to the oscillator 251, for a predetermined period in response to a counter enable signal EN to output the count bit signals ROD_OUT<n:0>. For reference, the predetermined period may be defined by a pulse width of the counter enable signal EN.

The comparator 253 may compare the count bit signals ROD_OUT<n:0> with the predetermined reference bit signals DEFAULT_SET<n:0> in response to a comparator enable signal COMP_EN, and output delay time set signals Delay_SET<m:0> based on the comparison result. The comparator 123 may be initialized in response to a reset signal RESET.

The delay unit 254 may generate the delay signal Delay_signal based on the delay time set signals Delay_SET<m:0> and reduce or increase delay time thereof based on the delay time set signals Delay_SET<m:0> to output the delay signal Delay_signal.

Therefore, the control logic 240 may output the page buffer control signals PB_Signals and the voltage generator control signals VG_Signals to control the page buffer unit 220 and the voltage generator 230, respectively, during the general operations of the semiconductor device 200. The control logic 240 may control the general operations of the semiconductor device 200 by sensing a process variation by the skew compensation circuit 250 and control timing of the page buffer control signals PB_Signals and the voltage generator control signals VG_Signals, which are output based on the delay signal Delay_signal whose delay time changes based on the sensed value. Therefore, even when a skew occurs by a process variation in the semiconductor device 200, the timing of these signals may be controlled during the program or read operation, so that a stabilized operation may be performed.

For example, when a slow skew occurs due to a process variation, the trigger circuit 241 may control operation timing by synchronizing activation timing of the page buffer control signals PB_Signals and the voltage generator control signals VG_Signals with a timing later than an initially set time. When a fast skew occurs, the trigger circuit 241 may control operation timing by synchronizing activation timing of the page buffer control signals PB_Signals and the voltage generator control signals VG_Signals with a timing earlier than the initially set time. In this manner, a stabilized operation may be performed.

FIG. 6 is a block diagram illustrating a semiconductor device 300 according to an embodiment of the present invention.

Referring to FIG. 6, the semiconductor device 300 may include a memory cell array 310, a page buffer unit 320, voltage generator 330, a control logic 340, and a skew compensation circuit 350.

The memory cell array 310 may include a plurality of memory cells. In the embodiment of the present invention, the memory cells may be non-volatile memory cells. The memory cells may be coupled to a plurality of bit lies BL coupled to the page buffer unit 320.

The page buffer unit 320 may include a plurality of page buffers. The page buffers may be coupled to the memory cell array 310 through bit lines BL. The page buffer unit 320 may temporarily store program data during a program operation and control voltage levels of the corresponding bit lines BL depending on the temporarily stored program data. In addition, the page buffer unit 320 may sense voltage levels of the bit lines BL during a read operation and temporarily store the sensed voltage levels as read data. The page buffer unit 320 may operate in response to page buffer control signals PB_Signals output from the control logic 340.

The voltage generator 330 may generate operating voltages applied to the memory cells of the memory cell array 310 during the program operation or the read operation. The voltage generator 330 may operate in response to voltage generator control signals VG_Signals, which are output from the control logic 340.

The control logic 340 may control the general operations of the semiconductor device 300 in response to a command CMD that is externally input. In other words, the control logic 340 may output page the buffer control signals PB_Signals for controlling the page buffer unit 320 and the voltage generator control signals VG_Signals for controlling the voltage generator 330 to perform a program operation and a read operation in response to the command CMD. In addition, the control logic 340 may output the voltage generator control signals VG_Signals to control voltage levels of the operating voltages output from the voltage generator 330, for example, a program voltage, a read voltage and a verify voltage based on voltage setting signals Voltage_SET<m:0> output from the skew compensation circuit 350.

The skew compensation circuit 350 may include an oscillator 351, a pulse counter 352, and a comparator 353.

The oscillator 351 may generate an output clock ROD_OUT in response to an oscillator enable signal ROD_EN. For example, the oscillator 251 may include a ring oscillator. The output clock ROD_OUT may be output as a clock signal having a predetermined cycle. A cycle of the output clock ROD_OUT may become longer or shorter depending on a PVT variation (e.g., a process variation) in a semiconductor device. The process variation may include a performance variation of transistors included in the oscillator 351 depending on factors, such as a thickness of a gate dielectric and a height of an effective field oxide layer, which may vary during a manufacturing process of the semiconductor device.

The pulse counter 352 may be initialized in response to a reset signal ROD_RST and count the number of clock cycles of the output clock ROD_OUT, which is output to the oscillator 351, for a predetermined period in response to a counter enable signal EN to output the count bit signals ROD_OUT<n:0>. For reference, the predetermined period may be defined by a pulse width of the counter enable signal EN.

The comparator 353 may compare the count bit signals ROD_OUT<n:0> output from the pulse counter 352 with the predetermined reference bit signals DEFAULT_SET<n:0> in response to a comparator enable signal COMP_EN, and output the voltage setting signals Voltage_SET<m:0> based on the comparison result. The comparator 353 may be initialized in response to a reset signal RESET.

Therefore, the control logic 340 may output the page buffer control signals PB_Signals and the voltage generator control signals VG_Signals to control the page buffer unit 320 and the voltage generator 330 during the general operations of the semiconductor device 300. The control logic 340 may control voltage levels of the operating voltages, which are output from the voltage generator 330, based on the voltage setting signals Voltage_SET<m:0>. Therefore, even when a skew occurs by a process variation in the semiconductor device 300, a program or read operation may be stably performed.

For example, when a slow skew occurs due to a process variation, the control circuit 340 may control the voltage levels of the operating voltages, which are output from the voltage generator 330, to more than the initially set level. When a fast skew occurs, the control logic 350 may control the voltage levels of the operating voltages to less than the initially set level. Therefore, a stabilized operation may be performed.

According to the embodiments of the present invention, in order to prevent a data output operation from becoming unstable due to a PVT variation (e.g., a process variation) in a semiconductor device, a change in cycle of an internal clock may be sensed, and driving of an output driver may be controlled by the sensed change, so that data may be stably output.

In addition, a process variation may be sensed by a change in cycle of an internal clock, and an internal driving voltage and a signal activation timing of an internal trigger circuit may be controlled based on the sensing result, so that operations of the semiconductor device may be stabilized.

As described above, the exemplary embodiments have been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
   a data output circuit configured to transfer an output data to an external data line during a data output operation; and
   a controller configured to generate control signals for controlling the data output circuit during the data output operation,
   wherein the data output circuit counts a cycle number of a clock, compares the cycle number with a reference value, transfers the output data to the external data line based on the comparing result and includes:
   an oscillator configured to generate the clock having a cycle varying depending on a variation;
   a comparator configured to compare the cycle of the clock with the reference value to generate a driver set code;
   an output pre-driver configured to output a driving control signal with a plurality bits based on an output data signal and the driver set code,
   wherein the number of activated bits of the driving control signal is determined based on the driver set code; and
   an output driver with a plurality of unit drivers, which are selectively activated based on the respective bits of the driving control signal.

2. The semiconductor device of claim 1, further comprising a pulse counter configured to count the cycle number of the clock for a predetermined period to generate a count bit signal.

3. The semiconductor device of claim 2,
   wherein the comparator compares the count bit signal with the reference value to output the driver set code.

4. The semiconductor device of claim 1,
   wherein the output pre-driver reduces the number of activated bits of the driving control signal to less than a predetermined number when the cycle number of the clock is greater than the reference value.

5. The semiconductor device of 1,
   wherein the output pre-driver increases the number of activated bits of the driving control signal to more than a predetermined number when the cycle number of the clock is less than the reference value.

6. A semiconductor device, comprising:
   a memory unit configured to include at least one memory chip, wherein the at least one memory chip stores data or outputs data stored therein;
   a data output circuit configured to receive the data, output from the memory unit, and transferring the data to an external data line; and
   a controller configured to control operations of the memory unit and outputting control signals to control the data output circuit during a data output operation,
   wherein the data output circuit controls a speed of transferring the data to the external data line based on a change of a cycle number of a clock corresponding to internal conditions and includes:
   an oscillator configured to generate an output clock having a cycle varying depending on the internal conditions;
   a comparator configured to compare the cycle number of the output clock with a predetermined value to output a driver set signal;
   an output pre-driver configured to output a plurality of pull-up and pull-down signals in response to an output data signal, wherein the output pre-driver controls the number of bit signals activated, among the pull-up and pull-down signals, in response to the driver set signal, and
   an output driver configured to outputting the data by controlling a voltage level of the external data line in response to the pull-up and pull-down signals, wherein the output driver controls a time period in which the voltage level of the external data line is controlled by the number of bit signals activated, among the pull-up and pull-down signals.

7. The semiconductor device of claim 6, wherein the driver set signal reflects a difference between the clock number of the output clock with the predetermined clock number.

8. The semiconductor device of claim 6, wherein the output pre-driver reduces the number of bit signals activated, among the pull-up and pull-down signals, to less than a predetermined number when the clock number of the output clock is greater than the predetermined clock number.

9. The semiconductor device of claim 6, wherein the output pre-driver increases the number of bit signals activated, among the pull-up and pull-down signals to more than a predetermined number when the clock number of the output clock is less than the predetermined clock number.

10. The semiconductor device of claim 6, wherein the output driver includes a plurality of drivers, and
    each of the drivers is activated in response to a single pull-up signal and a single pull-down signal.

11. The semiconductor device of claim 10, wherein the output driver reduces the time period in which the voltage level of the external data line is controlled when the number of bit signals activated, among the pull-up and pull-down signals, is increased to more than a predetermined number, and the output driver increases the time period in which the voltage level of the external data line is controlled when the number of bit signals activated, among the pull-up and pull-down signals, is reduced to less than the predetermined number.

12. A semiconductor device, comprising:
    a memory cell array including a plurality of memory cells;
    a peripheral circuit configured to apply operating voltages to a word line of the memory cell array during a program/read operation, wherein the peripheral circuit controls a voltage level of a bit line of the memory cell array or senses the voltage level of the bit line;
    a skew compensation circuit configured to sense a process variation and output the sensing result; and
    a control logic configured to output control signals to the peripheral circuit during the program/read operation,
    wherein the control logic controls activation timing of the control signals or voltage levels of the operating voltages based on the sensing result, and wherein the skew compensation circuit counts a cycle number of an output clock, compares the cycle number with a reference value and transfers the comparing result.

13. The semiconductor device of claim 12, wherein the control logic includes a trigger circuit.

14. The semiconductor device of claim 13, wherein the trigger circuit controls the control signals so that the control signals are output in synchronization with an earlier or later timing than an initially set timing based on the sensing result.

15. The semiconductor device of claim 14, wherein the skew compensation circuit includes:
   an oscillator configured to generate an output clock having a cycle varying depending on the variation;
   a pulse counter configured to count a clock number of the output clock for a predetermined period to generate a count bit signal;
   a comparator configured to compare the count bit signal with a predetermined clock number to output a delay time set signal; and
   a delay unit configured to generate a delay signal to control synchronization timing of the trigger circuit in response to the delay time set signal.

16. The semiconductor device of claim 12, wherein the peripheral circuit includes a voltage generator configured to generate the operating voltages, and
   the voltage generator outputs the operating voltages by changing voltage levels of the operating voltages in response to the control signals.

17. The semiconductor device of claim 16, wherein the skew compensation circuit includes:
   an oscillator configured to generate an output clock having a cycle varying depending on the variation;
   a pulse counter configured to count a clock number of the output clock for a predetermined period to generate a count bit signal; and
   a comparator configured to compare the count bit signal with a predetermined clock number to output a voltage setting signal,
   wherein the control logic outputs the control signals to control the voltage levels of the operating voltages, output from the voltage generator, in response to the voltage setting signal.

* * * * *